Figure 1:
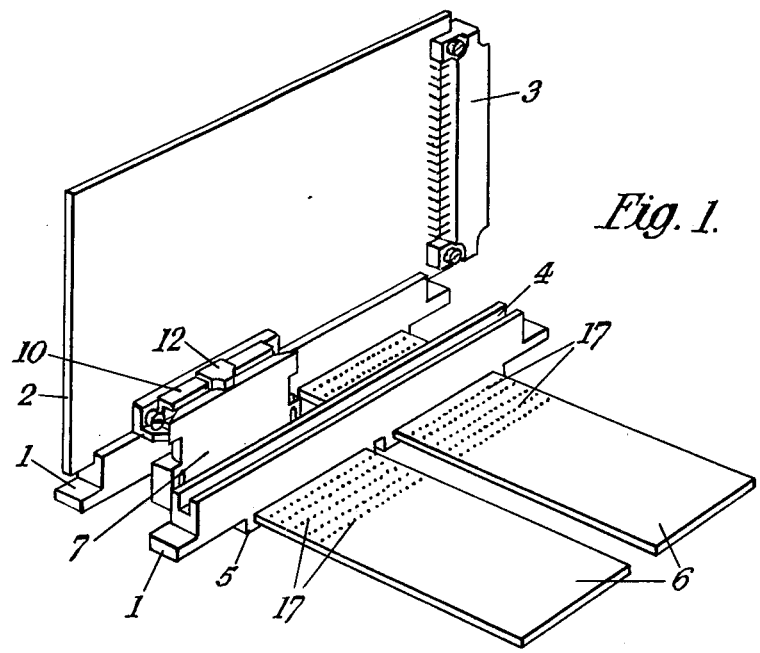

United States Patent [19]

Weiss

[11] 4,272,143
[45] Jun. 9, 1981

[54] RACK FOR CIRCUIT BOARDS

[75] Inventor: Harald Weiss, Bremen, Fed. Rep. of Germany

[73] Assignee: Vero Electronics GmbH, Bremen, Fed. Rep. of Germany

[21] Appl. No.: 86,334

[22] Filed: Oct. 19, 1979

[30] Foreign Application Priority Data

Oct. 21, 1978 [DE] Fed. Rep. of Germany ....... 2845884

[51] Int. Cl.³ ............................................. H05K 1/07
[52] U.S. Cl. ............................ 339/74 R; 339/75 MP
[58] Field of Search ............ 339/17 L, 17 LM, 17 M, 339/65, 66 M, 74 R, 75 MP, 176 MP; 361/407, 413, 415

[56] References Cited

U.S. PATENT DOCUMENTS

| 3,537,063 | 10/1970 | Beaulieu | 339/74 R |
| 3,576,515 | 4/1971 | Frantz | 339/74 R |

*Primary Examiner*—Neil Abrams
*Attorney, Agent, or Firm*—Watson, Cole, Grindle & Watson

[57] ABSTRACT

A rack for circuit boards in which connections are established not only to the rear ends of the board but also on at least one longitudinal edge of a board to bus strips extending at right angles to the boards by cooperating contact blocks on the boards and on the bus strips which establish electrical contact when a board is fully inserted into the rack.

2 Claims, 2 Drawing Figures

U.S. Patent Jun. 9, 1981 4,272,143

RACK FOR CIRCUIT BOARDS

This invention relates to racks for accommodating rectangular circuit boards of the type described for example in British Patent Specification Nos. 1,125,201 and 1,190,444, comprising pairs of opposed upper and lower horizontal guide rails into which the longer edges of the circuit boards can be slid from the front of the rack and vertically disposed edge connectors at the rear of the rack which cooperate with the vertical rear edges of the circuit boards.

Normally connections are made between the components on the individual circuit boards by wire wrapping between pins projecting rearwardly from the edge connectors and provision may be made for distributing power and signals to the circuit board from a bus bar disposed at the rear of the rack as described in British Patent Specification No. 1,503,277.

With a rack of this type, relatively long conducting tracks on the circuit boards are required to route the connections between the components mounted on the boards and the edge connectors. Such lengthy tracks are inconvenient in data systems in which high speed logic signals are required to be transmitted since they tend to cause attenuation of the signals and spurious noise.

The invention accordingly provides a rack for circuit boards comprising upper and lower sets of opposed horizontal guide rails into which the upper and lower edges of circuit boards can be slid, horizontal bus strips attached to at least one set of rails, the bus strips carrying spaced electrically conducting strips which are insulated from one another and serve for transmission of logic signals to the boards and also for transmission of signals between the boards, a set of insulating blocks on the edges of the boards which carry contacts connected to components on the boards, a set of cooperating other insulating blocks on the bus strips which carry contacts connected to the conducting strips on the bus strips, the blocks on the boards and the blocks on the bus strips inter-engaging with their respective contacts out of engagement with one another when a board is slid into the rack, and means operating as the board is slid fully home into the rack to effect relative movement of the blocks to bring the contacts carried by the board into engagement with the contacts carried by the bus strips.

Figure 2:
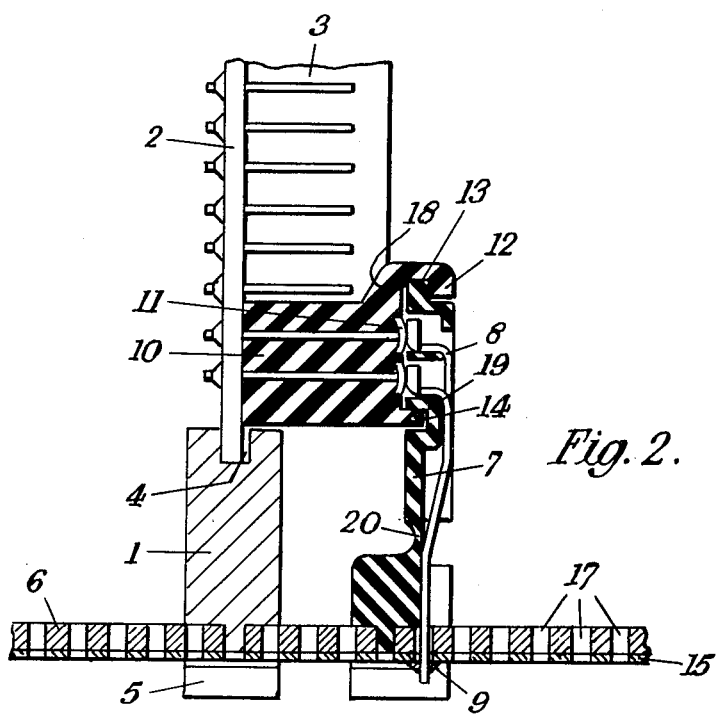

One embodiment of the invention will be described in detail, by way of example with reference to the accompanying diagrammatic drawings in which:

FIG. 1 is a perspective view showing only two of the lower guide rails of the rack and a single circuit board inserted into the rack, and FIG. 2 is a longitudinal section on a larger scale showing how electrical connections are established between the boards and the bus strips.

The rack consists of sets of upper and lower guide rails into which the upper and lower edges of circuit boards 2, each carrying at its rear end an edge connector 3, can be slid in the conventional manner. The guide rails have longitudinal grooves to accommodate the edges of the boards and only two only of the lower rails 1 are shown in FIG. 1, the upper rails being omitted.

Bus strips 6 of insulating material, extending horizontally and at right angles to the boards 2, are supported by pairs of hooks 5 on the undersurfaces of the rails 1. Each strip 6 carries on its undersurface a series of spaced parallel conducting strips 15, is pierced with holes 17 in a grid pattern and also carries a block 7 of insulating material, on which are mounted rows of spring contacts 8, each of which is connected by soldering at 9 to a conducting strip 15.

The lower edge of each board 2 carries a block 10 of insulating material, which engages a block 7 as the board is slid into the rack and carries contacts 11 which are connected to components mounted on the board near to the lower edge.

The block 10 has a hook 12 which forms a groove 18 for accommodating a nose 13 on the block 7 and a hook 14 on the block 7 engages with a nose 19 on the block 10. The groove 18 is so shaped that during the initial stage of insertion of the board into the rack the contacts 11 are maintained out of contact with the contacts 8 to prevent establishment of unwanted circuits between boards and between the boards and the bus strips 6 during movement of boards into and out of the rack. When, however, the board is almost fully home in the rack a correspondingly shaped part of the groove 18 covers the nose 12 to deflect the block 7 about a thinner portion 20 towards the boards to bring the contacts 8 into engagement with the contacts 11.

Electrical connections by a short route are thus established between the components on the boards and the strips 15, some of which serve to supply high speed data signals to the boards and others of which serve, with their associated contacts 8, to establish circuits between boards. The edge connectors 3 may be used to connect power supplies to the boards and to supply other signals to the components on the boards.

Immediately when a board is withdrawn from the fully home position in the rack, the groove 18 in the block 10 shifts the hook 12 away from the board to break the connections between the associated contacts 8 and 11.

Horizontal bus strips 6 may be fitted in similar fashion to the upper set of guide rails and connections established between the conducting strips on these bus strips and the boards in the same manner as is shown in FIG. 2 in association with the lower set of guide rails. The invention thus provides not only for transmission of signals by short routes to the components on the boards and between boards but provides, for a large number of connections to be made to each board at three sides of the boards.

If desired, the hooks 5 may be detachable units which can be snapped into engagement with the rails 1. This enables bus strips 6 of different widths to be fitted to the rails.

When, say, three integrated circuits each having for example forty terminals are mounted on a standard circuit board it is extremely difficult to provide satisfactory conducting tracks on the board between these circuits and a single edge connector on the rear of the board and the tracks in the case of the circuit remote from the edge connector may become unacceptably long and thin. This difficulty is greatly mitigated in accordance with the invention since many of the tracks can extend between the circuits and the longer sides of the board.

What I claim as my invention and desire to secure by Letters Patent is:

1. A rack for circuit boards comprising upper and lower sets of opposed horizontal guide rails into which the upper and lower edges of circuit boards can be slid, horizontal bus strips attached to at least one set of rails, the bus strips carrying spaced electrically conducting strips which are insulated from one another and serve for transmission of logic signals to the boards and also for transmission of signals between the boards, a set of insulating blocks on the edges of the boards which carry contacts connected to components on the boards, a set of cooperating other insulating blocks on the bus strips which carry contacts connected to the conducting strips on the bus strips, the blocks on the board and blocks on the bus strips inter-engaging with their respective contacts out of engagement with one another when a board is slid into the rack, and means operating as the board is slid fully home into the rack to effect relative movement of the blocks to bring the contacts carried by the board into engagement with the contacts carried by the bus strips.

2. A rack according to claim 1, in which the blocks on the bus strips have noses which engage grooves in the blocks on the boards, the grooves being shaped to cause deflection of the blocks on the bus strips to effect engagement of said contacts when the boards are fully home in the rack.

* * * * *